United States Patent [19]
Dave et al.

[11] Patent Number: 6,083,823
[45] Date of Patent: *Jul. 4, 2000

[54] METAL DEPOSITION PROCESS FOR METAL LINES OVER TOPOGRAPHY

[75] Inventors: Parth P. Dave, Wappingers Falls; Nancy A. Greco, Lagrangeville; Ernest N. Levine, Poughkeepsie; Darryl D. Restaino, Modena, all of N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/672,878

[22] Filed: Jun. 28, 1996

[51] Int. Cl.$^7$ .............................................. H01L 21/4763
[52] U.S. Cl. ..................... 438/625; 438/628; 438/636; 438/688
[58] Field of Search ..................... 438/687, 688, 438/628, 644, FOR 355, FOR 357, FOR 358, FOR 359, 625, 636; 257/765, 767, 771

[56] References Cited

U.S. PATENT DOCUMENTS

| | | | |
|---|---|---|---|
| 4,837,183 | 6/1989 | Polito et al. | 438/7 |
| 4,994,162 | 2/1991 | Armstrong et al. | 204/192.15 |
| 5,266,521 | 11/1993 | Lee et al. | 438/642 |
| 5,270,255 | 12/1993 | Wong | 438/643 |
| 5,318,923 | 6/1994 | Park | 438/652 |
| 5,356,836 | 10/1994 | Chen et al. | 438/627 |
| 5,374,592 | 12/1994 | MacNaughton et al. | 438/643 |
| 5,407,863 | 4/1995 | Katsura et al. | 438/687 |
| 5,665,641 | 9/1997 | Shen et al. | 438/643 |
| 5,807,760 | 9/1998 | Buckfeller et al. | 438/644 |

*Primary Examiner*—T. N. Quach
*Attorney, Agent, or Firm*—Whitham, Curtis & Whitham; Jay H. Anderson, Esq.

[57] ABSTRACT

A metal layer is formed at high deposition rate over severe topography by a two step process including formation of a seed layer by cold deposition followed by a second portion of the metal layer deposited at a temperature approximating but below a temperature at which metal from a lower metal layer can extrude through vias reaching thereto. The seed layer is preferably limited to a thickness at which the conformality of the cold-deposited metal will not significantly increase severity of surface topography, generally about one-fourth the thickness of the hot-deposited layer. Via connections are formed without voids and a more planar metal layer surface is formed which allows formation of a protective/anti-reflective layer with good integrity while enhancing subsequent lithographic patterning, thereby eliminating alteration of metal surface chemistry by resist developers and resultant residual metal included within the severe topography.

12 Claims, 1 Drawing Sheet

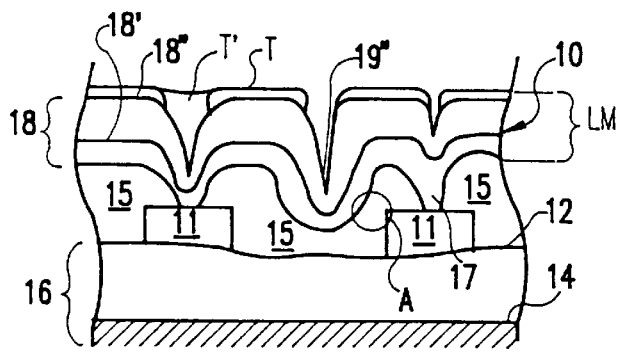
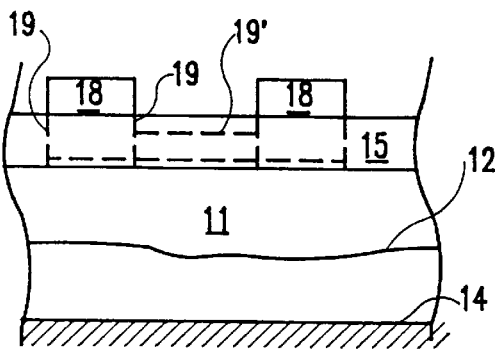
FIG.1A (RELATED ART)
FIG.1B (RELATED ART)
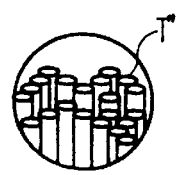
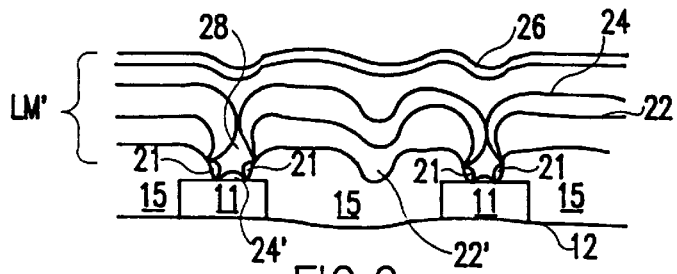
FIG.1C (RELATED ART)
FIG.2 (RELATED ART)
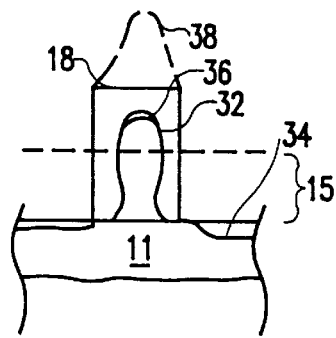
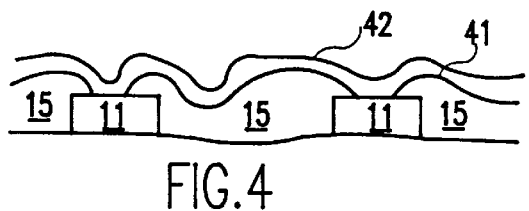
FIG.3 (RELATED ART)
FIG.4
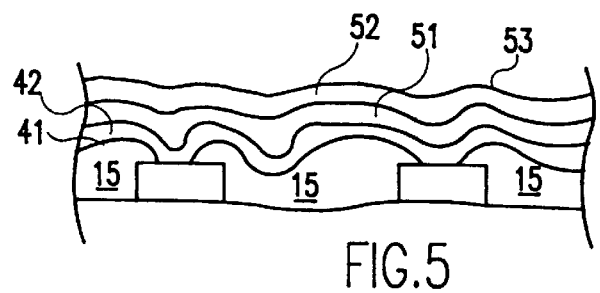
FIG.5
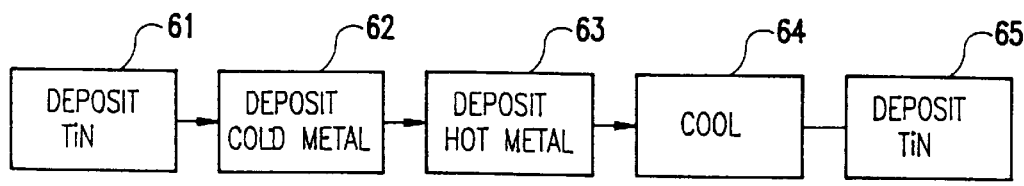
FIG.6

METAL DEPOSITION PROCESS FOR METAL LINES OVER TOPOGRAPHY

BACKGROUND OF THE INVENTION

1. Field of the Invention

The present invention generally relates to the manufacture of semiconductor integrated circuits and, more particularly, to the formation of layers of metal interconnection formed after formation of electronic components such as transistors, resistors and capacitors thereon.

2. Description of the Prior Art

Techniques for fabrication of semiconductor integrated circuits have become highly developed in recent years in order to achieve high performance components at increased integration density. It is often the case that components formed at reduced sizes exhibit improved performance in terms of reduced power consumption and increased switching speed. Additionally, high integration density allows increased functionality of the circuitry which can be formed on a single chip and reduced signal propagation time between components. Further, the formation of increased numbers of components on a chip can be done with little increase of process cost. Accordingly, there is substantial incentive toward higher levels of integration density and design rules permitting smaller minimum feature sizes for integrated circuits. Accordingly, techniques of material deposition and patterning must be continually developed to support design rules permitting smaller minimum feature sizes at acceptable levels of manufacturing yield.

To efficiently achieve high integration density, lithography is generally the process of choice to achieve a high degree of repeatability and high manufacturing yield at relatively low cost. However, lithographic exposures are most reliable when a resist is placed on a planar surface while it is the purpose of lithography to form patterns of material having a finite feature thickness in or on the surface at which it is performed. The complex component structures characteristic of modern semiconductor integrated circuits often require dozens or even hundreds of sequential lithographic processes to form and the formation of patterns of material over other patterned material often causes topography of sufficient severity to impose limits on, if not compromise, subsequent lithographic processes. While it is common to deposit a relatively thick layer of material which is later planarized by polishing, there are numerous structures which will not tolerate the mechanical loads imposed by the polishing process or the potential for surface contamination which are unavoidable in the polishing process.

Some structures formed over severe topography may be compromised by the topography even when seemingly formed in accordance with the design. Metal conductors, for example, are particularly vulnerable to metal migration when even slight irregularities are present which may cause localized concentration of current therein since metal migration is principally a current-driven diffusion process. Such concentration of current may also occur where conductors cross other structures and the conductor path abruptly changes direction, especially relative to the plane of the substrate on which the integrated circuit is formed. Unfortunately, as severity of topography increases, these locations of change of direction of the conductor path become more likely to be formed with reduced thickness which increases current density and the potential for metal migration.

Additionally, modern integrated circuits often utilize a metallization layer which is later patterned into conductors as substantially the last layer or last few layers to be deposited. The final metallization layer is often used to form connections to a previously formed conductor layer in order to accommodate needs of connections to cross each other. For example, the connections in the two layers can be linear and oriented orthogonally to each other. For high integration density, connection is often made to previously formed components or connections through apertures, referred to as vias, in insulator or passivation layers. These vias must be formed with high registration accuracy and are often formed at the minimum feature size allowed by the integrated circuit design rules in order to avoid making erroneous connections to or bridging between portions of components or connections.

Registration or position accuracy and size regulation when the vias are formed may be compromised by the severity of the surface topography on which a lithographic exposure must be made in order to form the vias and expose the component portions to which connections are to be made, increasing the need for small feature size of the vias in the lithographic process. Additionally, when the metal layer, in which connections are to patterned, is deposited, the vias themselves constitute severe topography which has been found to present difficulties in the formation of the metal layer. Further, for the final metal layer, similar topography will be caused at the surface of an insulator layer formed over a previously deposited array of conductors.

Ideally, vias are filled with metal during this process. However, the deposition of metal is not ideally conformal and the deposition tends to proceed more rapidly on the surface and near the top of the vias than at the bottom of the vias even when the vias are tapered to the maximum degree that does not consume such amounts of space as would reduce integration density. The differential of deposition rates between the top and bottom of a via becomes more pronounced as the process continues and may close the top of the via before the via can be completely filled. When this occurs, a void will remain in the via which is sometimes referred to as a "key-hole defect" because of its distinctive shape in cross-section. Such voids, of course, represent a severe irregularity in the conductor cross-section which can reduce manufacturing yield or increase the potential for failure after the integrated circuit is placed in service. Such a void is not observable by non-destructive inspection.

Topography of sufficient severity to reduce reliability of connections can occur even when the deposition does not close the top of the via, as is more often the case at locations between conductors of a previous metal layer, alluded to above. In this case, a cavity remains which can trap materials and/or prevent adequate coverage by a protective material, either of which can have other deleterious effects on a conductor. In particular, developers for lithographic resists may attack the metal (e.g. AlCu) by causing corrosion or other effects resulting from alteration of surface chemistry by the developers. In the case of AlCu metallization and some other metals and alloys, the altered surface chemistry of the metal acts as a mask which may reduce effectiveness of a subsequent etch, leaving residual metal deposits. Further, conformality of resist to severe topography may result in incomplete resist development or alteration of the surface chemistry of the metal which may result in similarly inadequate metal removal during the etching to pattern the metal into conductors, particularly between conductors of an underlying layer. Thus, when the metal layer is deposited over severe topography in a highly conformal manner, subsequent patterning may leave residual metal between connections which may form metal to metal shorts (when conductors are bridged intralayer or interlayer) or cause reduction in breakdown voltage between conductors.

Conformality of metal deposition can be controlled over a relatively wide range by the temperature at which deposition is carried out. Generally, low temperature (e.g. 150° C.) results in a high degree of conformality but small grain size. Grain size is a factor in resistance to metal migration and small grain size is generally associated with metal instability and low resistance to metal migration. Further, at low temperatures grain orientation will often be vertical (e.g. substantially perpendicular to the substrate) and will cause surface irregularity (although on a much smaller scale) when the device is cooled from even a lower temperature. The smaller irregularity can cause a so-called "ring defect" in a final metal layer such as titanium nitride (TiN), used to protect underlying AlCu from resist developer and to form an antireflective surface, which may be fractured upon cooling.

Metal deposition at higher temperatures produces larger grain size and a generally more planar surface (improving lithographic patterning but reducing conformality of the deposit and greatly increasing the likelihood that voids and topography of increased severity will be formed. Thus, reduction of conformality by higher temperature metal deposition is associated with reduced yield, particularly from metal-to-metal shorts. Further, at temperatures above about 350° C., at which temperature AlCu expands significantly (also exhibited by other alloys and metals at similar but different temperatures), metal from lower metal connections will extrude into the vias causing damage to both the underlying connections and the via connection.

Scanning electron microscope (SEM) imaging has shown residual metal to occur where cusps develop in the surface of the metal as a result of the topography of the underlying insulator layer deposited over conductors which are generally parallel to each other and of substantial thickness. Since these cusps reach a level at which the lower level connectors are formed and the last metal layer is generally used to form conductors orthogonal thereto, both interlayer and intralayer bridging may easily occur: the former when any defect is present in the lower level oxide (which must also be lithographically patterned to form tapered vias but where the lithographic patterning can be compromised by severe topography) and the latter since residual metal extending orthogonally to the last metal layer conductors will be favored.

In summary, so-called cold deposition is too conformal and increases surface topography while forming grains which are susceptible to metal migration. Deposition at increased temperatures forms voids. Unfortunately, with increasing temperature of deposition, the differential between deposition at the top and bottom of severe topography (about 1.2 microns apart) develops before a reduction in conformality sufficient to reduce cusp formation occurs because of the similar effects of differing deposition mechanisms over severe topography. Therefore, there is a need for a new deposition process which avoids void formation while reducing cusping that forms not only peaks but the valleys therebetween and presents a more nearly planar surface for lithographic patterning and which allows avoidance of residual metal deposits even though topography presented by valleys and tapered vias is similar.

SUMMARY OF THE INVENTION

It is therefore an object of the present invention to provide a metal deposition process which provides reliable and complete via filling together with formation of a substantially planar metal layer surface deposited over severe topography.

It is another object of the present invention to provide a process of metal deposition which improves the reliability of coverage by a protective metal layer such as TiN.

It is a further object of the invention to reduce or eliminate residual metal after patterning of a metal layer deposited over severe topography.

In order to accomplish these and other objects of the invention, a method of depositing a metal layer on a non-planar surface that includes underlying metal exposed by vias is provided including the steps of depositing a first portion of a metal layer at a relatively low temperature, and depositing a second portion of the metal layer over the first portion of the metal layer at a relatively high temperature approximating but below a temperature at which the underlying metal will extrude through the vias.

In accordance with another aspect of the invention, a method of making a semiconductor device including metal connections in a metal layer and a further metal layer, including the steps of depositing a first portion of a metal layer at a relatively low temperature, and depositing a second portion of said metal layer over the first portion of the metal layer at a relatively high temperature approximating but below a temperature at which the further metal layer will extrude through the apertures, applying a protective layer over the second portion of the metal layer, and etching the protective metal layer and the metal layer to form an array of conductors which are not bridged by residual metal.

In accordance with a further aspect of the invention, a semiconductor device is provided including an array of conductors patterned from a metal layer formed over severe topography of at least one micron from top to bottom of said severe topography and including connections formed through vias in an insulating layer, said vias being formed without voids, and wherein said severe topography does not include residual metal from said metal layer extending between said conductors.

BRIEF DESCRIPTION OF THE DRAWINGS

The foregoing and other objects, aspects and advantages will be better understood from the following detailed description of a preferred embodiment of the invention with reference to the drawings, in which:

FIGS. 1A and 1B are cross-sectional views taken in orthogonal directions of a structure formed by a cold metal deposition process of record, FIG. 1C is a detail view of a surface of a last metal layer in FIG. 1A or 1B, FIG. 2 is a cross-sectional view of a structure formed by a hot metal deposition process for comparison with FIG. 1, FIG. 3 is a cross section view of a structure showing metal extrusion from a metal conductor into a via at an elevated temperature of metal deposition, FIGS. 4 and 5 illustrate the process of the present invention, and FIG. 6 is a flow chart depicting the methodology of the invention.

DETAILED DESCRIPTION OF A PREFERRED EMBODIMENT OF THE INVENTION

Referring now to the drawings, and more particularly to FIG. 1, there is shown, in cross-section, a structure 10 formed by the current process of record. FIGS. 1–3 are labelled "Related Art" since it is to be understood that no portion of any of these Figures is admitted to be Prior Art as to the present invention. These Figures are merely provided to increase the ease with which an understanding and appreciation of the invention may be conveyed to and obtained by the reader. FIG. 1 is referred to as the process of record since it has provided the most advantageous and desirable results prior to the present invention which constitutes an improvement thereover.

Specifically FIG. 1 shows a generally planar surface 12 (for clarity of illustration) of, for example, a passivation or insulating layer at a location above a substrate surface 14. It is assumed that electronic components will have been formed in the space 16 between them in a manner which is not important to the practice of the present invention and that the surface 12 may, accordingly, be considerably less planar for that reason. On the other hand, if the underlying structure in region 16 can tolerate the mechanical and/or chemical requirements of polishing, surface 12 may, in fact, be highly planar.

On surface 12, a plurality of conductors 11 will have been formed and are assumed to be in an array in which the conductors run generally parallel to each other. An insulating layer 15, such as an oxide is formed thereover by a process which is not important to the practice of the invention but it is assumed that planarization of layer 15 is not feasible for mechanical or process reasons. Vias 17, preferably of a tapered form achieved by deposition, reactive ion etch (RIE) in an argon atmosphere, are also shown and it should be appreciated that the topography thus presented by the vias is similar to that of the surface of the insulator between conductors 11.

Last metal layer LM is a composite of a thick metal layer 18 (e.g. of AlCu) and a relatively thin protective and/or anti-reflective layer T (e.g. of TiN). While layer 18 is deposited in a single step in the process of record, surfaces 18' and 18" have been depicted to show the progress thereof as the highly conformal deposition increases the severity of the topography as deposition proceeds. When layer 18 is complete, layer T is deposited thereover. However, at this point, topography is so severe that layer T cannot conformally cover layer 18, leaving gaps T'.

This structure is then covered with a resist which is exposed and developed. If the resist fills gaps T', it will be difficult to adequately expose and remove by development. Even if it is removed or if it does not, in fact fill T', developer can attack and/or alter the surface chemistry of layer 18 at those locations, also functioning as a resist during later etching. In either case, therefore, metal in the bottom of a groove will be effectively masked (e.g. 19") and residual metal will remain after etching. As shown more clearly in FIG. 1B, if this masking occurs, the etch will not remove metal to boundary 19 and will allow a bridging metal-to-metal short 19' to remain. It should be noted that the extension of metal layer 18 to or near the level of conductors 11 as shown at the circle marked with reference character "All " may allow an interlayer short to develop if layer 15 is imperfectly formed or damaged during patterning to form vias 17.

It should also be noted for comparison with FIG. 2, described below, that as severity of topography increases, uniformity of thickness of the metal layer is lost, causing thinning, increase of resistance and current concentration, in the vias and valleys between the cusps. This thinning, favoring metal migration and potential alteration of electrical function may be aggravated where undesired masking 19" does not occur. Thus, even optimal processing may cause the manufacturing yield to be compromised by thinning of the conductor or development of bridging connections, or both, at small feature sizes.

Further, referring now to FIG. 1C, the grain structure produced in metal layer 18 by the process of record is shown in somewhat idealized form. Specifically, the grain structure may develop with vertically oriented grains (e.g. having a crystallographic axis at a steep angle to the surface of layer 18). Severe topography is best filled by collimated deposition (e.g. sputtering) which may favor such a crystallographic grain structure. As the layer 18 cools, the grains contract differentially since different crystallographic axes from grain to grain may be so oriented. Where large differences occur between grains, even though on a very small scale, such as is indicated at T", the layer T may be fractured. Such a fracture prevents the layer T from protecting layer 18 from resist developer and small so-called circle defects result.

Referring now to FIG. 2, The effects of hot (e.g. above about 150° C.) is shown. Surface 12, conductor 11 and insulator 15 as shown in FIG. 1A. If last metal layer LM' is deposited at such a higher temperature, the deposition on the surface will occur much faster than in the vias and valleys as depicted by intermediate surfaces 22, 24 and 26. Note that the deposition in the corners of the vias and valleys is very thin or voids 21 caused, compromising conductivity and resistance to metal migration (although larger grain is developed). Voids 21 would result in electrical discontinuities and reduce manufacturing yield. Keyhole voids 28 also develop when the surface 24 closes over them, as will occur unless deposition rates are held to extremely low levels inconsistent with acceptable throughput. While a relatively planar surface 26 develops for formation of protective layer T, keyhole voids 28 may be enlarged during etching when exposed to etchant as the structure is patterned (e.g. at planes above and/or below the plane of the cross-section shown) further compromising conductivity. Further, if a void is unprotected from alkaline developer at any point, the entirety of the keyhole void may be contaminated and residual metal in deposit 22' and/or 24' may remain after etching.

The cross-sectional view of FIG. 3 is taken in the same direction as FIG. 1B for clarity. While it might be expected that metal in last metal layer LM would flow somewhat at even higher temperatures to reduce incidence of voids 22' and 24', little improvement has been observed. However, metal of conductors 11 tends to extrude into the vias and within metal layer 18, as shown at 32, due to the expansion of the material thereof. This may cause fracture of metal layer 18 as well as other effects deleterious to good electrical continuity. Further, upon cooling, the conductor 11 contracts leaving reduced thickness, as shown at 34. The extrusion may recede also, leaving a fracture or void 36. Additionally, the extrusion has been observed to be a further source of severe topography, as illustrated by dashed line 38, when deposited metal is displaced. Therefore, deposition of last metal layer at elevated temperatures does not solve the problems with the process of record. Additionally, even if some improvement could be achieved by higher temperature deposition in some designs, the higher temperature would need to the accommodated in the heat budget of previously formed devices and may not be feasible.

Referring now to FIGS. 4, 5 and 6, the deposition process in accordance with the present invention will now be described. It is considered much preferable that a thin layer 41 of titanium-containing material be first deposited, as illustrated at 61 of FIG. 6, to improve contact resistance and overall reliability. However, the titanium-containing layer is not necessary to the successful practice of the invention. It is sufficient for the realization of the meritorious effects of the present invention to deposit a first portion of a metal (e.g. AlCu) layer to a thickness of about 2000–4000 Angstroms, depending on the final intended layer thickness, by cold deposition (62 of FIG. 6) followed by completion of the deposition (63 of FIG. 6) at a somewhat more elevated temperature. As a perfecting feature of the invention, a cooling step 64 is provided before deposition 65 of TiN.

Specifically, the "cold" deposited metal (e.g. AlCu) layer should preferably be deposited at or below about 150° C. in the usual fashion to a thickness in the range of about 10% to 35% (but not generally exceeding 50%) and preferably about 20% to 30% and, more preferably for small feature sizes and spacings, about 20% of the final metal layer thickness. This thickness should be limited to that which will not significantly increase the severity of the topography (e.g. narrowing of the valleys between cusps in the insulator layer at locations between conductors and at tapered vias). That is, suitable thickness of the "cold" deposited layer, as a portion or percentage of the total conductor thickness will vary with via hole dimensions or geometry (bottom diameter, taper and via hole depth), generally increasing with increasing depth and decreasing diameter and taper. This layer acts as a seed layer which provides wetting of the surface for the subsequent "hot" deposition. Further, being highly conformal, the "cold" deposition layer portion serves to deposit metal where voids 21 (FIG. 2) might otherwise occur during "hot" deposition.

Following the "cold" deposition, the temperature of the device is raised to a temperature preferably in the range above which substantial mobility of metal atoms will be achieved but below that which will cause softening and significant volumetric expansion of previous metal connections to avoid extrusion of metal into the vias, as discussed above in connection with FIG. 3 and further metal deposited. For AlCu, the preferred temperature is in the range of 300° C. to 350° C. (for underlying AlCu) and preferably close to the upper limit of this range. This temperature would, of course, differ for other underlying metals or alloys.

The thickness of the "hot" deposition portion of the metal layer should complete the desired total thickness (less the thickness of any protective metal layers or other layers such as layer 61 which may be deposited) and is thus preferably proportional to the thickness of the "cold" deposition portion of the metal layer (e.g. "cold" thickness:"hot" thickness is preferably about 1:4, depending, as noted above, on via hole geometry). Total thickness of the metallization layer, of course, depends on the product requirements of the device being fabricated. For example, in current designs, 20,000 Angstroms total thickness is appropriate to logic circuits but 10,000 Angstroms total thickness would be appropriate to DRAMs.

In FIG. 5, the portion of the metal layer deposited at elevated temperature is illustrated by regions 51 and 52 to illustrate the progress of the deposition. It should be noted that the high temperature deposition on the seed layer 42 has been found not to exhibit the effects of greater rate of deposition on the surface or cusps than in the valleys evidently due to some combination of wetting and/or seeding (with more numerous orientations of crystallographic structure provided by the small grain developed at low temperatures) and/or possibly reflow and/or grain reformation in the cold deposited layer 42 as well as the high mobility of metal atoms deposited during the hot deposition or reflow of the hot deposited material. It is not clear what portion of the overall effect is due to each or any of these parameters or conditions in accordance with the invention but it has been experimentally verified and is significant that voids, such as 21 and 28 of FIG. 2, and/or extrusions, as illustrated in FIG. 3, do not generally occur while the surface becomes increasingly planar as the hot metal deposition proceeds. In practice, screening vias for voids by measurement of electrical resistance shows metal filling of vias to be uniformly complete, in accordance with the invention, as verified by observed uniformly low resistance. In general, any cusps which remain are generally grain driven and are generally sufficiently separated that the valleys between them do not present sufficiently severe topography to compromise manufacturing yield by residual metal.

Once the metal layer has reached the desired thickness, it is preferred that a cooling step 64 be provided. As discussed above and illustrated in FIG. 1C, cooling, preferably to close to room temperature, provides for collapse of the grain structure of the metal layer. Particularly since the hot deposited grain structure is relatively large, the resulting microtexture of the surface can then be readily covered by a thin layer 53 of deposited protective or anti-reflective metal, such as TiN, or other material which might otherwise be fractured by grain collapse if the structure were to 5 be cooled subsequent to deposition of such a layer. This cooling step 64 is thus sufficient to suppress the formation of circle defects as described above.

The above described metal deposition method has been found to avoid the production of voids in vias and reduce the severity of topography of valleys between cusps such that a layer of protective material can be much more reliably formed, preventing both circle defects and the occurrence of residual metal after etching for patterning of conductors from the last metal layer. Further, the surface resulting from the hot metal deposition is sufficiently more planar than would occur in the process of record that the lithographic process for patterning of the layer is enhanced. It should be recognized that while the present invention, as described above, is particularly intended for the formation of a last metal layer in an integrated circuit device, the methodology is applicable to improving the uniformity and avoiding current concentrating thinning of metal in any application in which metal is deposited over more or less severe topography. For example, in other applications involving integrated circuits, the invention would be applicable to any or all metal layers or structures insofar as the heat budget thereof allows.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. A method of depositing a metal layer on a non-planar surface, said surface including a further metal layer exposed by apertures, said method including the steps of depositing a first portion of said metal layer at a first temperature of approximately 150° C. or lower, and depositing a second portion of said metal layer over said first portion of said metal layer at a second temperature in the range of 300° C. to 350° C., said second temperature being higher than said first temperature and approximating but below a temperature at which said further metal layer will extrude through said apertures, and above a temperature at which substantial mobility of metal atoms is achieved.

2. A method as recited in claim 1, wherein one of said metal layer and said further metal layer is an alloy of aluminum and copper.

3. A method as recited in claim 1, including the further step of depositing a titanium-containing layer prior to said depositing of said first portion of said metal layer.

4. A method as recited in claim 1, including the further step of cooling said metal layer and said surface sufficiently, subsequent to the step of depositing said second portion, to collapse grain in said metal layer.

5. A method according to claim 4, further comprising the step of depositing a protective/antireflection layer on said metal layer subsequent to the step of cooling.

6. A method as recited in claim 1, including the further step of depositing a protective/antireflection layer on said metal layer.

7. A method as recited in claim 6, wherein said protective/antireflection layer includes TiN.

8. A method according to claim 1, wherein a thickness of said first portion of said metal layer is approximately one-fourth a thickness of said second portion of said metal layer.

9. A method of making a semiconductor device including metal connections in a metal layer and a further metal layer, including the steps of depositing a first portion of a metal layer at a first temperature of approximately 150° C. or lower, and depositing a second portion of said metal layer over said first portion of said metal layer at a second temperature in the range of 300° C. to 350° C., said second temperature being higher than said first temperature and approximating but below a temperature at which said further metal layer will extrude through apertures, and above a temperature range at which substantial mobility of metal atoms will be achieved, applying a protective layer over said second portion of said metal layer, and etching said protective metal layer and said metal layer to form an array of conductors which are not bridged by residual metal.

10. A method as recited in claim 9, including the further step of collapsing grain structure of said metal layer by cooling prior to depositing said protective layer.

11. A method as recited in claim 9, including the further step of depositing an adhesion layer prior to depositing said first portion of said metal layer.

12. A method as recited in claim 9, wherein a thickness of said first portion of said metal layer is approximately one-fourth a thickness of said second portion of said metal layer.

* * * * *